United States Patent
Tanaka et al.

(10) Patent No.: US 10,903,813 B2
(45) Date of Patent: Jan. 26, 2021

(54) PHASE SHIFTER

(71) Applicant: RENESAS ELECTRONICS CORPORATION, Tokyo (JP)

(72) Inventors: Tomoyuki Tanaka, Tokyo (JP); Takahiro Nakamura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/575,078

(22) Filed: Sep. 18, 2019

(65) Prior Publication Data

US 2020/0136581 A1    Apr. 30, 2020

(30) Foreign Application Priority Data

Oct. 24, 2018 (JP) .................................. 2018-200211

(51) Int. Cl.
| | |
|---|---|
| *H03H 7/21* | (2006.01) |
| *H03H 7/18* | (2006.01) |
| *H03H 7/38* | (2006.01) |
| *H03F 1/32* | (2006.01) |
| *H03H 7/01* | (2006.01) |
| *H03H 7/00* | (2006.01) |

(52) U.S. Cl.
CPC .............. *H03H 7/18* (2013.01); *H03F 1/3282* (2013.01); *H03H 7/004* (2013.01); *H03H 7/0115* (2013.01); *H03H 7/21* (2013.01); *H03H 7/38* (2013.01)

(58) Field of Classification Search
CPC .. H03H 7/18; H03H 7/19; H03H 7/21; H03H 7/0115; H03H 7/38; H03H 11/36; H01P 5/12; H03F 1/3282; H03F 1/3288
USPC .......... 333/32, 138, 109, 110, 112, 117, 118, 333/124
See application file for complete search history.

(56) References Cited

U.S. PATENT DOCUMENTS

| | | | |
|---|---|---|---|
| 2004/0085112 A1* | 5/2004 | Miyaguchi | ............... H03H 7/18 327/233 |
| 2016/0344086 A1* | 11/2016 | Golcuk | .................... H03H 7/21 |
| 2019/0165739 A1* | 5/2019 | Lyalin | ..................... H03F 3/245 |

FOREIGN PATENT DOCUMENTS

JP      2007-184718 A      7/2007

* cited by examiner

*Primary Examiner* — Stephen E. Jones
(74) *Attorney, Agent, or Firm* — McDermott Will & Emery LLP

(57) ABSTRACT

A phase shifter capable of improving phase accuracy by a simple method is provided. The phase shifter includes a hybrid coupler circuit including inductors with mutual inductances, an amplifying circuit, an impedance matching circuit provided between the hybrid coupler circuit and the amplifying circuit. The impedance matching circuit includes a first resistance element connected to an output node of the hybrid coupler circuit, a capacitance element connected between the first resistance element and the ground line in series, another inductor connected in parallel with the first resistance element, and a second resistance element provided between the inductor and the ground line in series.

13 Claims, 30 Drawing Sheets

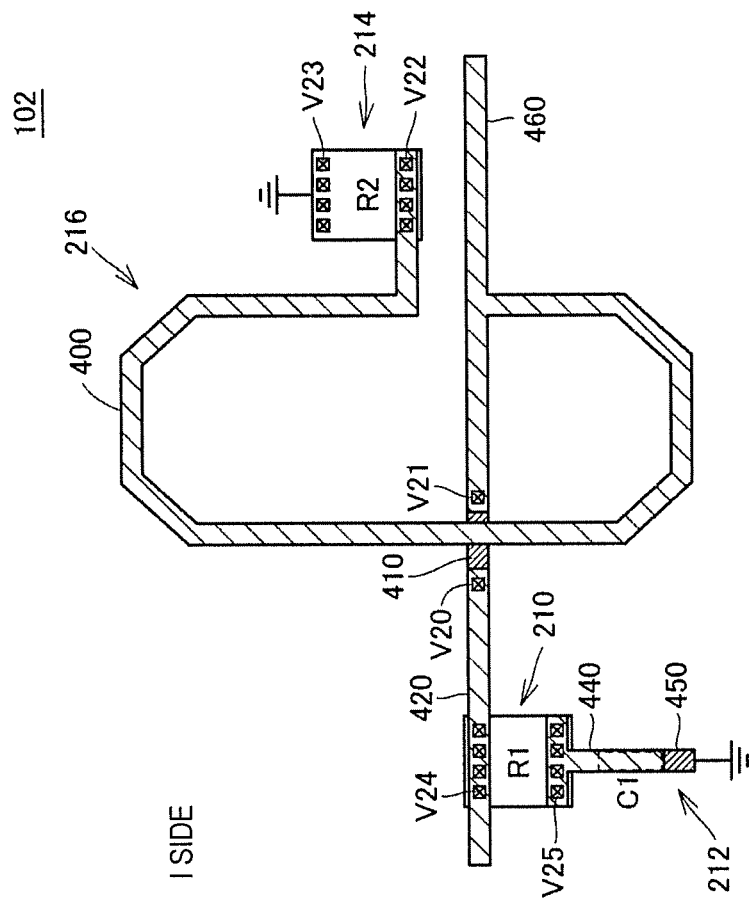

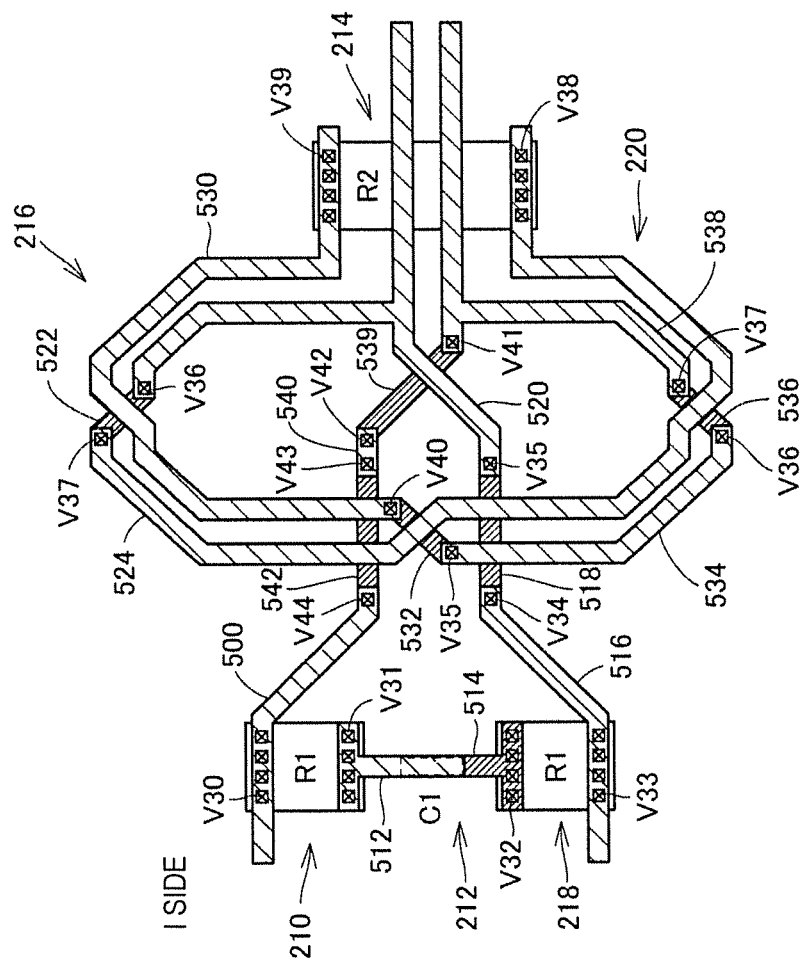

PHASE SHIFTER

CROSS-REFERENCE TO RELATED APPLICATIONS

The disclosure of Japanese Patent Application No. 2018-200211 filed on Oct. 24, 2018 including the specification, drawings and abstract is incorporated herein by reference in its entirety.

BACKGROUND

The present disclosure relates to a phase shifter capable of adjusting the phase of a high-frequency signal.

The Background of the Invention

In recent years, phase shifters for high frequencies have been used in various fields. For example, in millimeter wave radar and the like, a phased array antenna is known.

It is possible to perform beam scanning by connecting a phase shifter to each antenna element that radiates a beam, and controlling the phase shift amount.

In this respect, improvement of the phase shift accuracy of the phase shifter is an important problem, and it is necessary to perform impedance matching with high accuracy.

In this respect, Japanese Patent Laid-Open No. 2007-184718 proposes a matching circuit capable of suppressing variation in impedance of a high-frequency circuit.

Prior-Art Document

SUMMARY

On the other hand, in the case of a phase shifter using a hybrid coupler, there is a problem that there is a possibility of variation depending on the load impedance and the capacitance between the couplers, and thus it is difficult to secure robustness.

In this respect, the circuit disclosed in Patent Document 1 does not consider variations in capacitance, and has a problem that the phase accuracy cannot be sufficiently obtained by the above-described method.

The present disclosure has been made to solve the above-mentioned problems, and provides a phase shifter capable of improving phase accuracy by a simple method.

Other objects and novel features will become apparent from the description of this specification and the accompanying drawings.

Means of Solving the Problems

A phase shifter according to an aspect of the present disclosure includes: a hybrid coupler circuit including a first inductor and a second inductor for branching signals having equal amplitudes different in phase by 90 degrees from an input of a high-frequency signal and outputting the signals from the first and second output nodes, respectively; first and second amplifier circuits for amplifying signals from the first and second output nodes of the hybrid coupler circuit; first and second impedance matching circuits provided between the hybrid coupler circuit and the first and second amplifier circuits for impedance matching; and a synthesizer circuit for synthesizing outputs of the first and second amplifier circuits. The first impedance matching circuit includes a first resistance element coupled to the first output node, a first capacitance element coupled between the first resistance element and the ground line in series, a third inductor coupled in parallel with the first resistance element, and a second resistance element provided between the third inductor and the ground line in series. The second impedance matching circuit includes a third resistance element coupled to the second output node, a second capacitance element coupled between the third resistance element and the ground line in series, a fourth inductor coupled in parallel with the third resistance element, and a fourth resistance element provided between the fourth inductor and the ground line in series.

According to one Embodiment, the disclosed phase shifter can improve phase accuracy in a simple manner.

BRIEF DESCRIPTION OF THE DRAWINGS

FIG. 13A and FIG. 13B are diagrams illustrating the wiring structure of the matching circuit 102 according to the first embodiment;

FIG. 20A and FIG. 20B are diagrams illustrating the wiring structure of the first matching circuit 102 #, 104 # according to the second embodiment;

DETAILED DESCRIPTION

Figure 1:
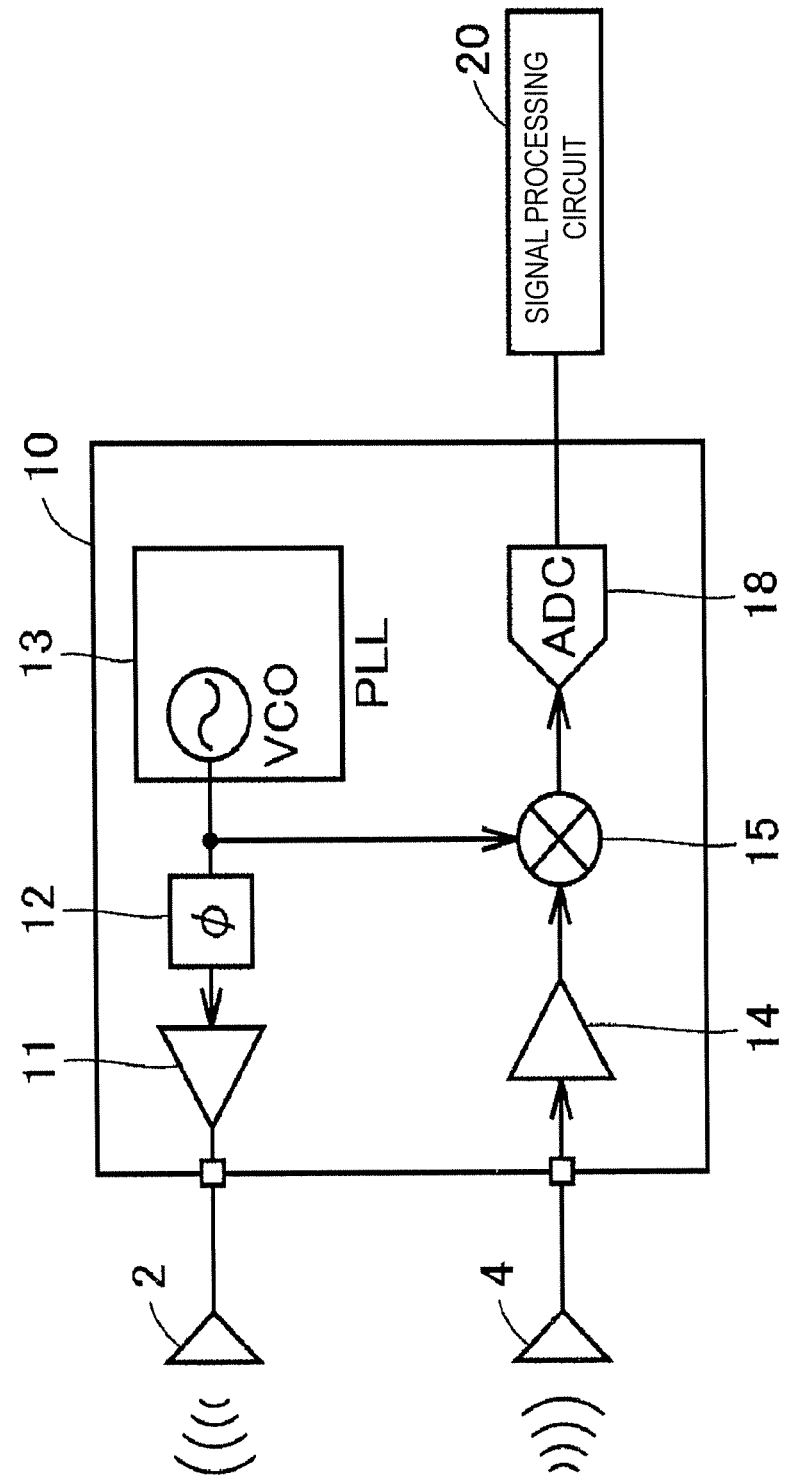
FIG. 1 is a diagram illustrating an outline of a radar system 1 in which a phase shifter according to a first embodiment is used.

In the drawings, the same or corresponding components are denoted by the same reference numerals, and description thereof will not be repeated.

(A first embodiment) FIG. 1 is a diagram illustrating an outline of a radar system 1 in which a phase shifter according to a first embodiment is used;

Referring to FIG. 1, a radar system 1 includes a high-frequency block 10, a signal processing circuit 20, a transmission antenna 2, and a reception antenna 4.

The high-frequency block 10 transmits a millimeter-wave electromagnetic wave from the transmission antenna 2. The high-frequency block 10 receives the reflected electromagnetic wave through the reception antenna 4, and outputs a digital signal to the signal processing circuit 20.

The signal processing circuit 20 receives the input of the digital signal output from the high-frequency block 10 and performs predetermined signal processing. For example, the signal processing circuit 20 acquires distance information or the like based on the digital signal according to the received electromagnetic wave.

The high-frequency block 10 includes a power amplifier 11, a phase shifter 12, a PLL circuit 13, a low-noise amplifier 14, a mixer (i.e. synthesizer circuit) 15, and an AD conversion circuit 18.

The PLL circuit 13 generates and outputs a predetermined high-frequency signal. The phase shifter 12 adjusts the phase of the high-frequency signal.

Figure 2:
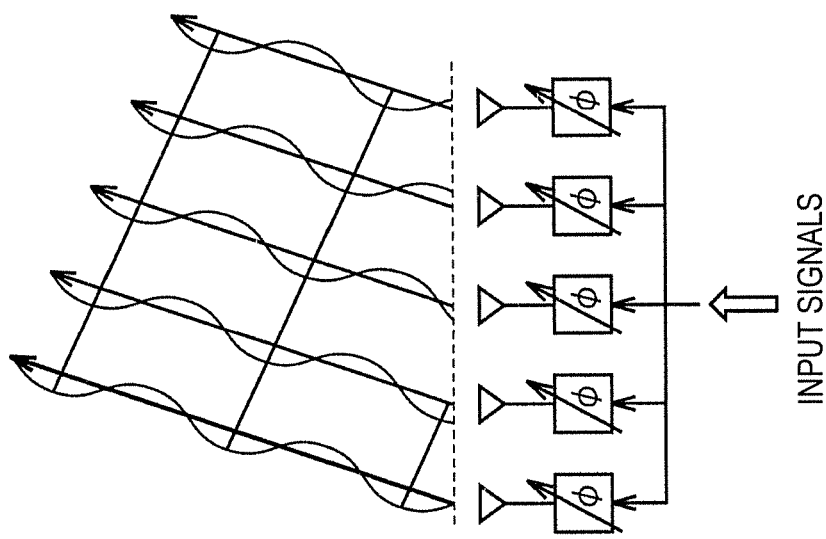
FIG. 2 is a conceptual diagram illustrating a method of using the phase shifter 12 according to the first embodiment.

The power amplifier 11 amplifies the high-frequency signal output from the phase shifter 12. Although a single of phase shifter will be described here for the sake of simplicity, a configuration in which a plurality of phase shifters 12 are provided as shown in FIG. 2 is also possible.

The amplified signal is output to the outside via the transmission antenna 2 from the power amplifier 11. The reception antenna 4 receives the electromagnetic wave reflected from the object.

The low noise amplifier 14 amplifies the signal while suppressing the noise component of the signal received via the reception antenna 4.

The mixer (synthesizer circuit) 15 outputs a desired signal obtained by mixing the output signal from the low noise amplifier 14 and the signal from the PLL circuit 13.

The AD conversion circuit 18 performs analog-to-digital conversion processing on the signal output from the mixer 15, and outputs the processed signal to the signal processing circuit 20.

FIG. 2 is a conceptual diagram illustrating a method of using the phase shifter 12 according to the first embodiment. As shown in FIG. 2, a plurality of phase shifters 12 receive input signals and adjust the phases of the respective signals. This makes it possible to perform beamforming by adjusting the angle of the wave front of the electromagnetic wave, thereby making it possible to scan the radar.

Figure 3:
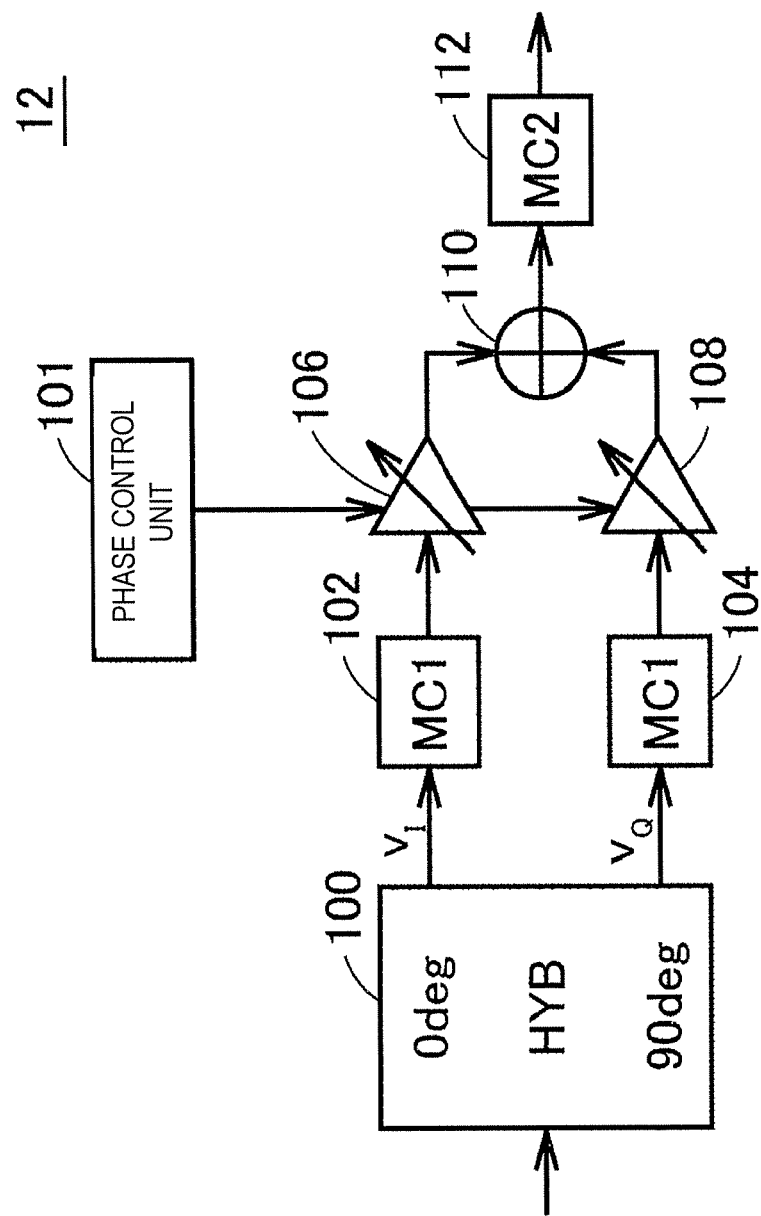
FIG. 3 is a block diagram of a phase shifter 12 according to the first embodiment.

FIG. 3 is a block diagram illustrating the phase shifter 12 according to the first embodiment. Referring to FIG. 3, the phase shifter 12 includes a hybrid coupler 100, first matching circuits (MC1) 102 and 104, and second matching circuits (MC2) 112, drivers 106 and 108, and a synthesizer circuit 110.

The hybrid coupler 100 branches and outputs signals having equal amplitudes different in phase by 90 degrees from the input of the high-frequency signal.

The first and second matching circuits 102, 104, and 112 are circuits for impedance matching.

The drivers 106 and 108 amplify the signals of the first matching circuits 102 and 104 (MC1).

The synthesizer circuit 110 synthesizes and outputs the outputs of the drivers 106 and 108. The second matching circuit 112 (MC2) is a circuit for matching the impedances from the output of the synthesizer circuit 110 to the input of the next stage.

Figure 4:
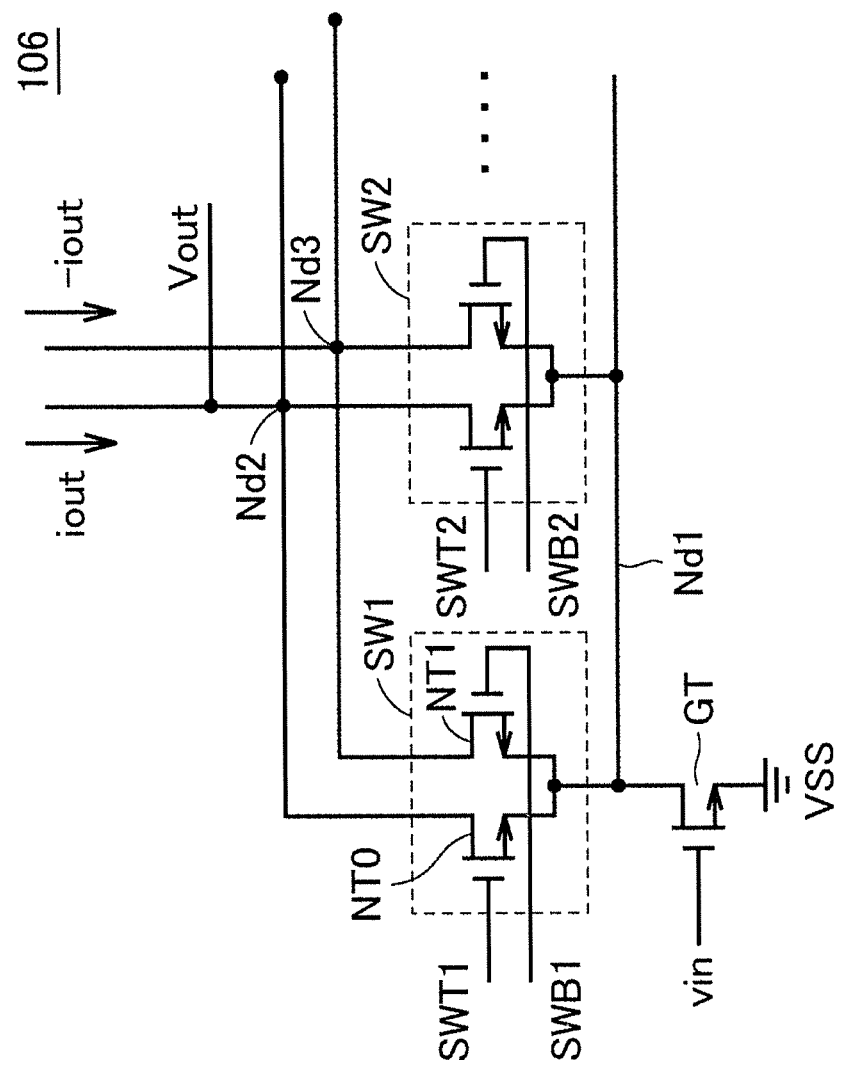
FIG. 4 is a diagram illustrating a circuit configuration of a driver 106 according to the first embodiment.

FIG. 4 is a diagram illustrating a circuit configuration of the driver 106 according to the first embodiment. As shown in FIG. 4, the driver 106 includes a gate transistor GT receiving inputs from the first matching circuit 102, and a plurality of switch circuits SW1, SW2 coupled in parallel to each other.

The gate transistor GT is provided between the node Nd1 and the ground voltage VSS, and the gate of the gate transistor GT receives inputs from the first matching circuit 102.

The plurality of switching circuits SW are coupled in parallel between the node Nd1 and the nodes Nd2 and Nd3, respectively.

The switching circuit SW1 includes an N-channel MOS transistors NT0, NT1. The N-channel MOS transistor NT0 is coupled between the node Nd1 and the node Nd2, and the gate of the N-channel MOS transistor SWT1 receives the control signal SWT1. The N-channel MOS transistor NT1 is coupled between the node Nd1 and the node Nd3, and the gate of the N-channel MOS transistor receives the control signal SWB1. The other switch circuits SW have the same configuration as the switch circuit SW1, include two N-channel MOS transistors, and receive inputs of control signals SWT and SWB, respectively.

The phase control unit 101 outputs control signals SWT and SWB for individually controlling the switch circuits SW to control the phase of the output signal Vout. The output current flowing through the drivers 106 is adjusted in accordance with on/off of the switching circuits SW, and the phase of the output signals Vout output from the nodes Nd2 can be adjusted. The driver 108 has the same configuration.

Figure 5:
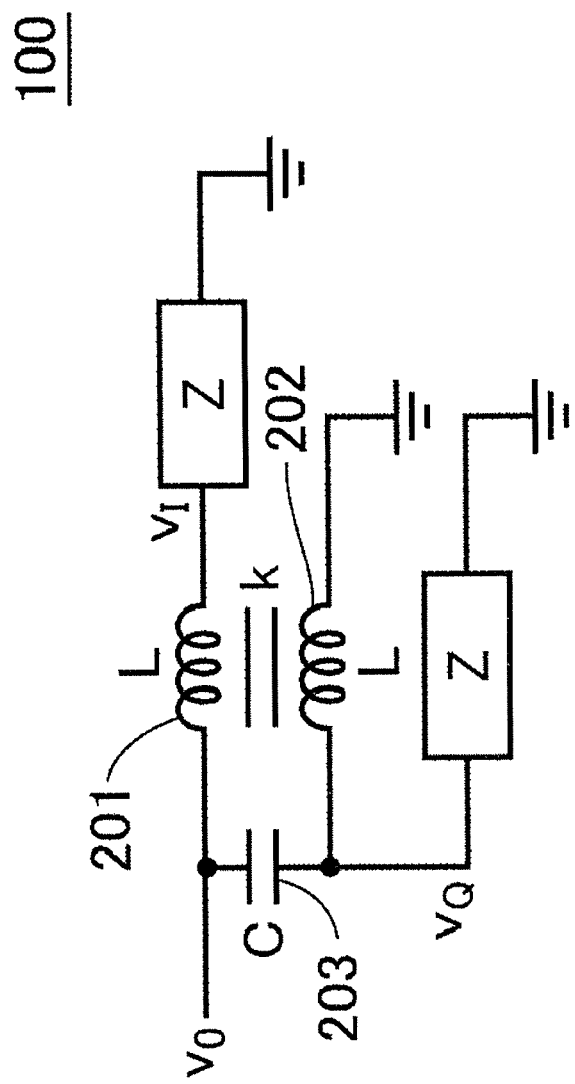
FIG. 5 is a circuit diagram of a hybrid coupler 100 according to the first embodiment.

FIG. 5 is a diagram illustrating a circuit of the hybrid coupler 100 according to the first embodiment. As shown in FIG. 5, the hybrid coupler 100 includes inductors 201 and 202.

The inductor 201 and the inductor 202 are provided in parallel with each other. The input signal VO is input to one side of the inductor 201. The other side of the inductor 201 is coupled to a load (Z). The output signal VI is output from the other side of the inductor 201 to the load (Z).

The inductor 201 is coupled to the inductor 202 with mutual inductance. The coupling coefficient k is shown. The capacitance 203 provided between the inductors 201 and 202 is a capacitance between the wirings of the inductors 201 and 202. One side of the inductor 202 is coupled to another load (Z). The other side of the inductor 202 is grounded. Here, the inductance values of the inductors 201 and 201 are shown as L. The value of the capacitance between the wirings is shown as C.

The output signal VQ is output from one side of the inductor 202 to the load (Z). The hybrid coupler 100 outputs output signals VI and VQ against the input signal VO.

The output signals VI and VQ are expressed by the following equations (1) and (2).

[Equation 1]

$$v_I = \frac{1}{A}[(Z(1-(1-k)\omega^2 LC) + j\omega L] \quad (1)$$

$$v_Q = \frac{1}{A}[(\omega^2 LCZ) + j\omega L(k - (1-k^2)\omega^2 LC] \quad (2)$$

The condition that the output signals VI and VQ have different phase shift by 90 degrees and equal amplitudes is expressed by the following equations (3) and (4).

[Equation 2]

$$Re(V_I) = Im(V_Q) \quad (3)$$

$$Im(V_I) = -Re(V_Q) \quad (4)$$

The first item of the output signal VI is the real part Re (VI), and the second item of the output signal VI is the imaginary part Im (VI). The first item of the output signal VQ is the real part Re (VQ), and the second item of the output signal VQ is the imaginary part Im (VQ).

Based on the above equations, the output impedance needs to satisfy the following equation (5). The inductance value and the capacitance value between the wiring of the hybrid coupler 100 must satisfy the following equations (5) and (6).

[Equation 3]

$$Z = \frac{1}{\omega C} \quad (5)$$

$$LC \approx \frac{5 - k^2}{4\omega^2} \quad (6)$$

Figure 6:
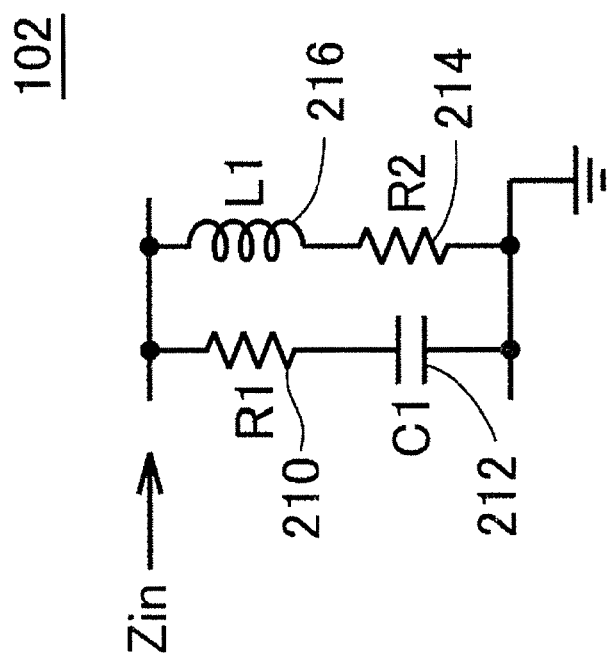
FIG. 6 is a circuit diagram of a first matching circuit 102 according to the first embodiment.

FIG. 6 is a circuit diagram of the first matching circuit 102 according to the first embodiment. As shown in FIG. 6, a resistance element 210 and a capacitance element 212 are coupled in series. An inductor 216 is coupled in parallel with the resistance element 210, and a resistance element 214 is coupled in series with the inductor 216. Since the matching circuit 104 has the same configuration as the matching circuit 102, detailed description thereof will not be repeated. Resistance values of the resistance elements 210 and 214 are shown as R1 and R2, respectively. The inductance value of the inductor 216 is shown as L1. The value of the capacitance element 212 is shown as C1.

In a high-frequency circuit, impedance matching is necessary to minimize power loss. Since the subsequent stage of the hybrid coupler 100 has generally a gate input circuit, i.e., a capacitive impedance, impedance matching is realized using an inductive element.

The impedance Zin of the matching circuit 102 is expressed by the following equation (7).

[Equation 4]

$$Zin = \frac{(R_1^2 + 1/\omega^2 C_1^2)(R_2^2 + \omega^2 L_1^2)}{(R_1^2 + 1/\omega^2 C_1^2) \cdot R_2 + (R_2^2 + \omega^2 L_1^2) \cdot R_1} \quad (7)$$

Figure 7:
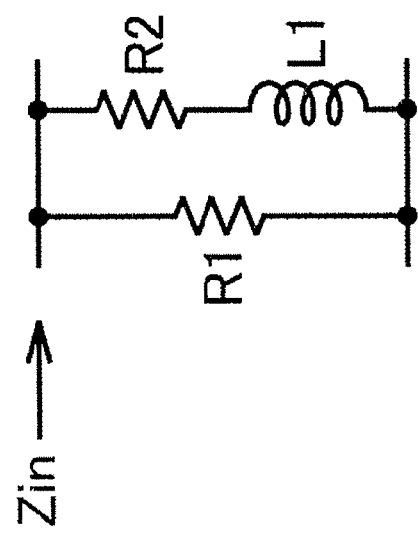
FIG. 7 is a circuit diagram of a matching circuit according to a comparative example.

FIG. 7 is a circuit diagram of a matching circuit according to a comparative example. As shown in FIG. 7, the capacitor C1 is not provided.

The impedance Zin of the matching circuit is expressed by the following equation (8).

[Equation 5]

$$Zin = \frac{R_1(R_2 + \omega L_1)}{R_1 + (R_2 + \omega L_1)} \quad (8)$$

On the other hand, there is a possibility that variations in capacitance between wirings occur due to process variations. That is, there is a possibility that the capacitance value C, which is the capacitance between the wirings, shown in Expression (5), changes.

Therefore, for impedance matching, it is necessary to compensate the variation of the capacitance value C, which is the capacitance between the wirings, but as apparent from the above equation (8), the variation of the capacitance between the wirings cannot be compensated with the impedance Zin of the matching circuit according to the comparative example.

Figure 8:
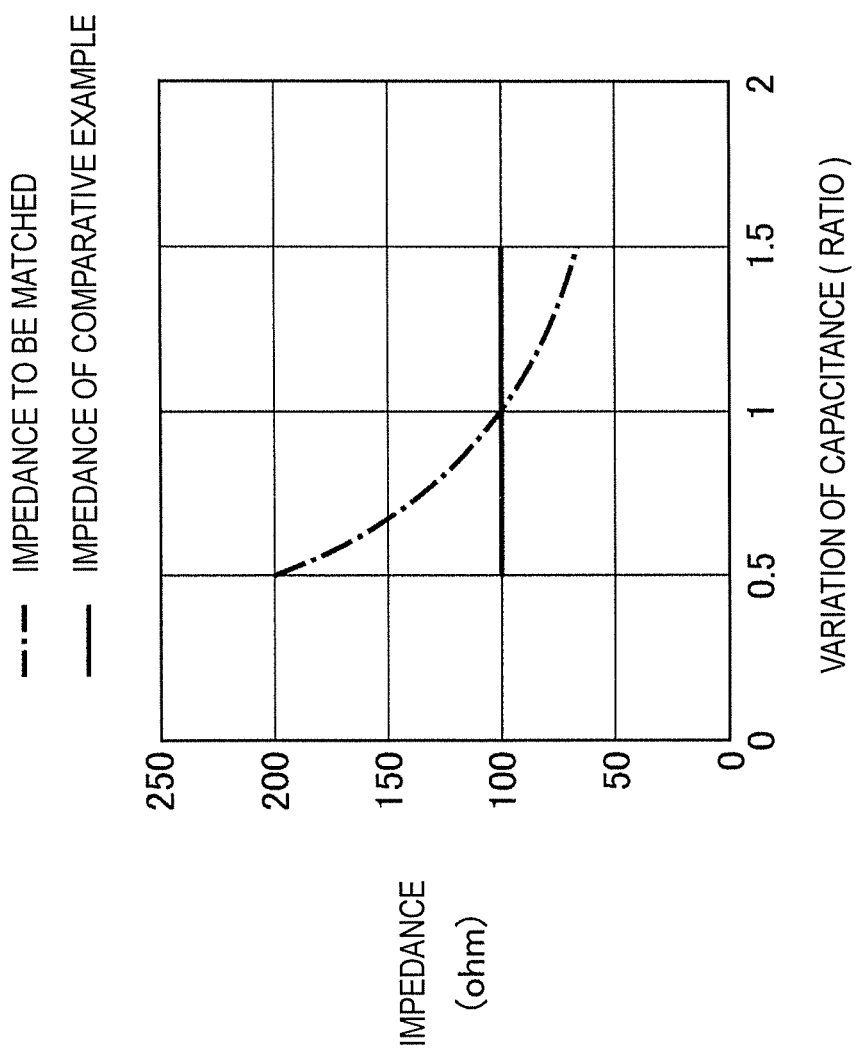
FIG. 8 is a diagram illustrating an impedance to be matched as an output load of the hybrid coupler 100 and an impedance of the matching circuit according to a comparative example.

FIG. 8 is a diagram illustrating the impedance to be matched as the output load of the hybrid coupler 100 and the impedance of the matching circuit according to the comparative example.

As shown in FIG. 8, no capacitance element is provided in the matching circuit according to the comparative example. The impedance to be matched with respect to the variation of the capacitance value C, which is the capacitance between wirings, fluctuates, but the impedance of the matching circuit cannot follow it and deviates greatly.

Figure 9:
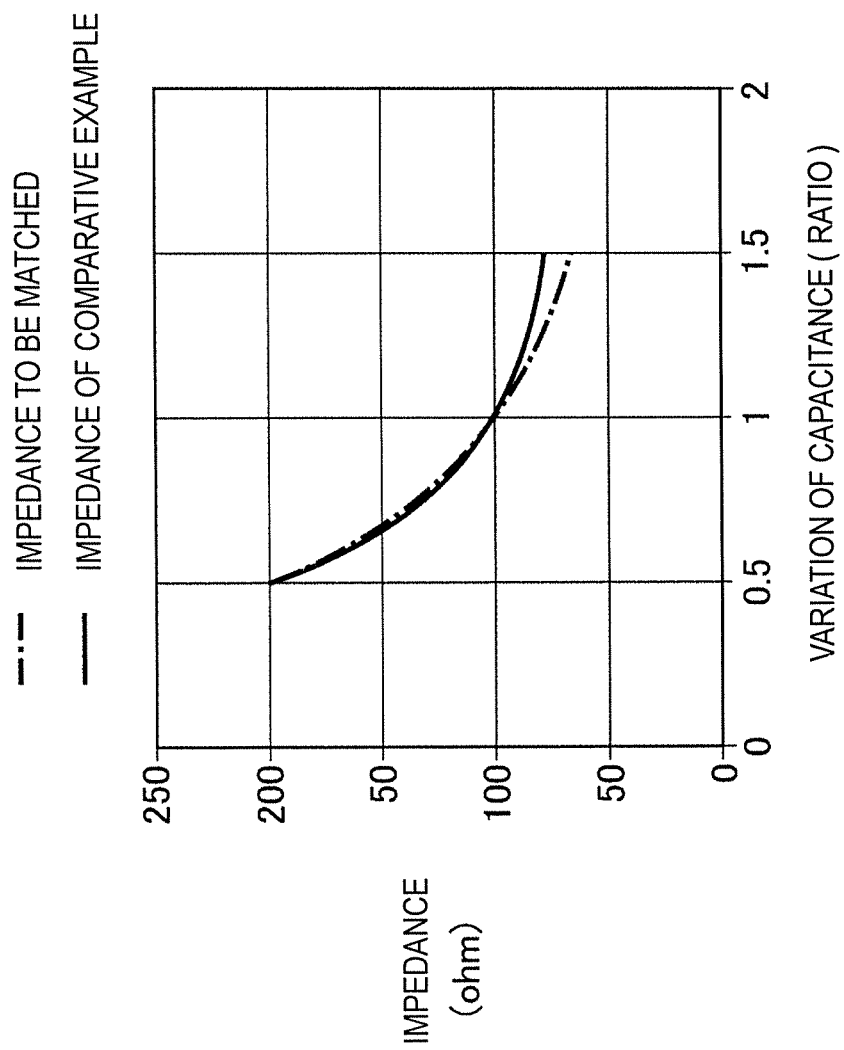
FIG. 9 is a diagram illustrating an impedance to be matched as the output load of the hybrid coupler 100 and an impedance of the matching circuit according to the first embodiment.

FIG. 9 is a diagram illustrating the impedance to be matched as the output load of the hybrid coupler 100 and the impedance of the matching circuit according to the first embodiment.

As shown in FIG. 9, a capacitor 212 is provided in the matching circuit according to the first embodiment. The impedance to be matched with respect to the variation of the capacitance value C, which is the capacitance between wirings, fluctuates, but the impedance of the matching circuit according to the first embodiment can be made to follow it by the capacitance value C1.

Figure 10A:
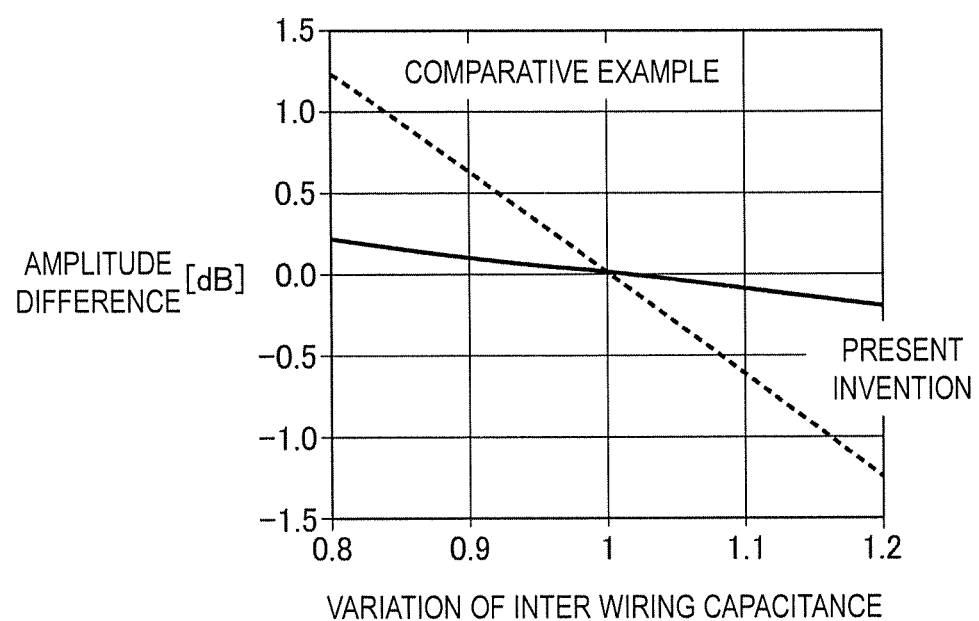
FIG. 10A and FIG. 10B are simulation results of amplitude difference and phase difference when the matching circuits 102, 104 according to the first embodiment are used for the hybrid coupler 100.
Figure 10B:
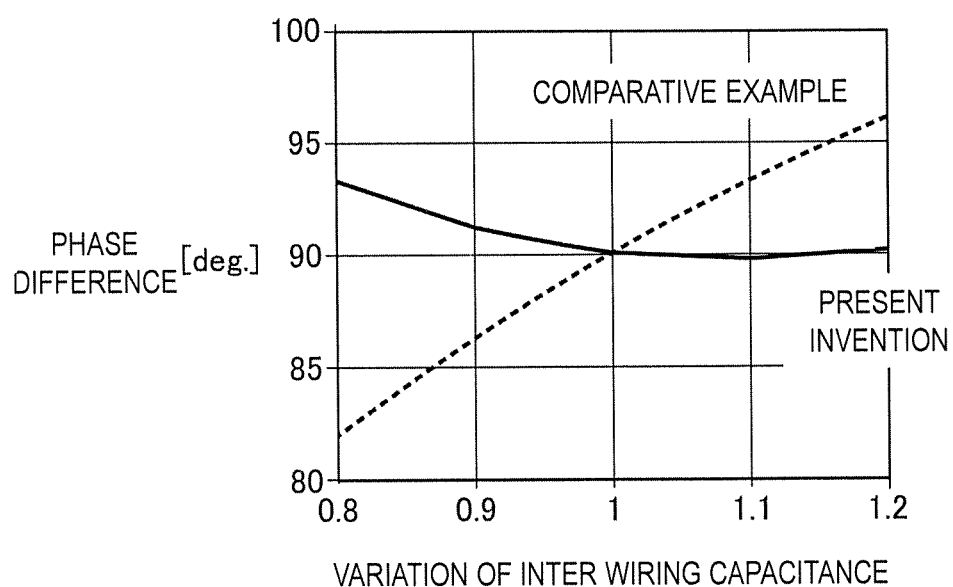

FIG. 10 is a simulation result of the amplitude difference and the phase difference in the case that the matching circuits 102 and 104 according to the first embodiment are used for the hybrid coupler 100.

As shown in FIG. 10, the difference in the output signals VI and VQ of the hybrid coupler 100 with respect to the variation of the capacitance between the wirings is shown.

Both the amplitude difference and the phase difference are stable even for a capacitance between wirings of ±10% compared to the matching circuit according to the comparative example.

Therefore, the matching circuit according to the first embodiment can compensate variation of capacitance between wirings.

Therefore, it is possible to suppress the process variation, and it is possible to perform the phase control of the phase shifter with high accuracy. As a result, it is possible to improve the directivity of the beam forming of the radar system 1, and it is possible to perform the scanning of the radar with high accuracy. That is, the phase shifter according to the first embodiment can improve the phase accuracy by a simple method.

In addition, since the process variation can be canceled only by the passive element, it is possible to suppress an increase in power consumption.

FIG. 11 is a diagram illustrating a wiring structure of the hybrid coupler 100 according to the first embodiment.

Figure 11A:
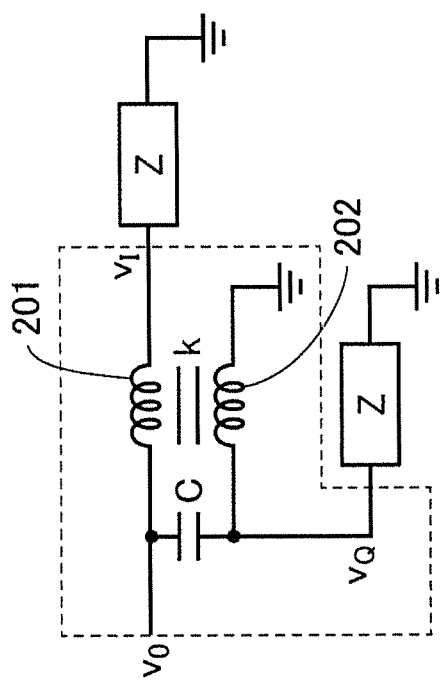
FIG. 11A, FIG. 11B and FIG. 11C are diagrams illustrating a wiring structure of the hybrid coupler 100 according to the first embodiment.

Referring to FIG. 11, FIG. 11A shows a circuit diagram of the hybrid coupler 100. The components of the region enclosed by the dotted line are included.

Figure 11B:
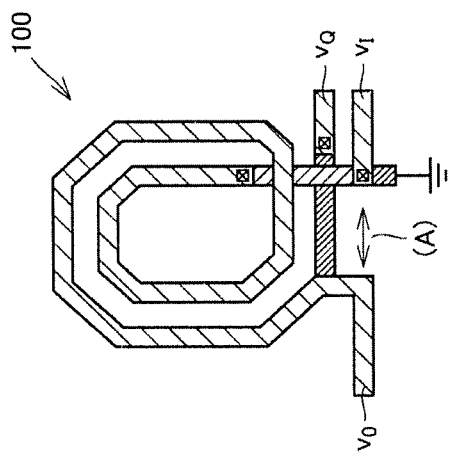

FIG. 11B shows a case where the hybrid coupler 100 having a vertical structure is viewed from above.

Figure 11C:
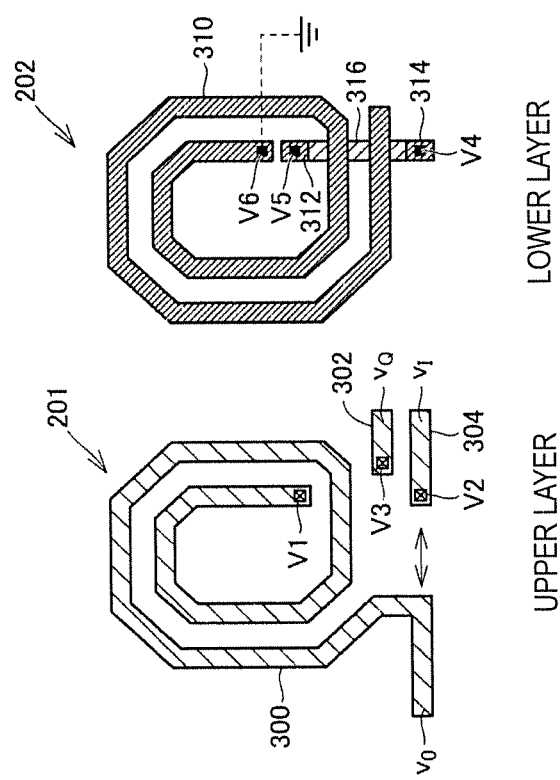

FIG. 11C is a diagram in which an upper layer and a lower layer of the hybrid coupler 100 having a vertical structure are shown separately.

Referring to FIG. 11C, wiring 300 is spirally formed to form inductor 201. One side of the terminals is coupled to an input terminal of the input signal VO. The other side is coupled to the wiring 312 in the lower layer through the via V1. The wiring 312 is coupled to the wiring 316 further provided in the lower layer via the via V5. The wiring 316 is coupled to the wiring 314 through the via V4. The wiring 314 is coupled to the wiring 304 through the via V2. The wiring 304 is coupled to an output terminal for outputting the output signal VI.

A wiring 310 is provided to form the inductor 202 in a lower layer to overlap with the wiring 300. The inductor 201 and the inductor 202 are coupled by mutual inductance.

One end side of the spiral center portion of the wiring 310 is coupled to a wiring coupled to a ground line (not shown) via a via V6.

The other end side of the spiral outer portion of the wiring 310 is coupled to the wiring 302 in the upper layer through the via V3. The wiring 302 is coupled to an output terminal for outputting the output signal VQ.

FIG. 12 is another diagram illustrating the wiring structure of the hybrid coupler 100 according to the first embodiment.

Figure 12A:
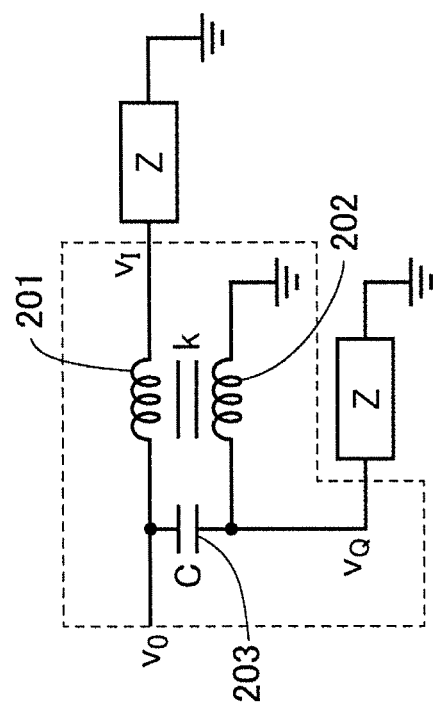
FIG. 12A and FIG. 12B are other diagrams illustrating the wiring structure of the hybrid coupler 100 according to the first embodiment.

Referring to FIG. 12, FIG. 12A shows a circuit diagram of the hybrid coupler 100. The components of the region enclosed by the dotted line are included.

Figure 12B:
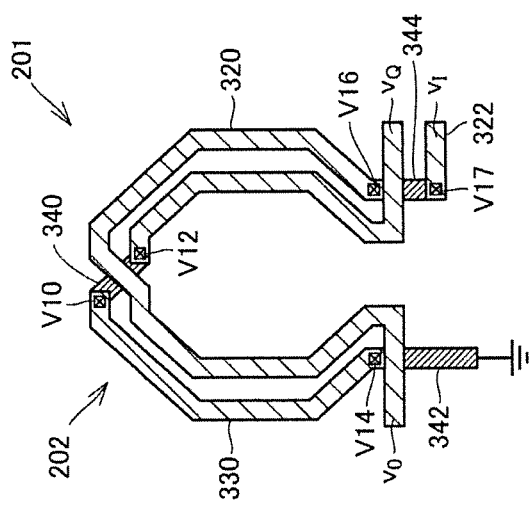

FIG. 12B shows a case where the hybrid coupler 100 having a lateral structure is viewed from above.

Referring to FIG. 12B, a wiring 320 is provided in a loop shape to form an inductor 201. One side of the terminals is coupled to an input terminal of the input signal VO. The other side is coupled to the lower wiring 344 through the via V16. The wiring 344 is coupled to the wiring 322 in the upper layer through the via V17. The wiring 322 is coupled to an output terminal for outputting the output signal VI.

The wiring 330 is provided in a loop shape to form the inductor 202 adjacent to the wiring 320. The inductor 201 and the inductor 202 are coupled by mutual inductance.

One end side of the wiring 330 is coupled to the wiring 342 through the via V14, and the wiring 342 is coupled to a ground line (not shown).

The wiring 330 is coupled to the wiring 340 through the vias V10 and V12 in order to straddle the wiring 320. The other end of the wire 330 is coupled to an output terminal for outputting the output signal VQ.

Figure 13A:
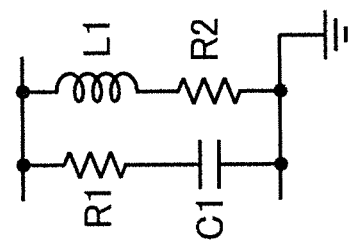

FIG. 13 is a diagram illustrating a wiring structure of the matching circuit 102 according to the first embodiment. Referring to FIG. 13, FIG. 13A shows a circuit diagram of the matching circuit 102. As shown in FIG. 13A, the matching circuit 102 includes resistance elements R1 and R2, a capacitance element C1, and an inductor L1.

FIG. 13B shows a case where the matching circuit 102 is viewed from above. Referring to FIG. 13B, a wiring 400 is provided in a loop shape to form an inductor L1. One side is coupled to the resistance element 214 disposed in the lower layer via the via V22. The resistance element 214 is coupled to a ground line via a via V23.

The wiring 400 is coupled to the wiring 460. The wiring 460 is coupled to an input terminal of the driver 106 which is a load.

The wiring 460 is coupled to the wiring 410 in the lower layer through the via V21 in order to straddle the wiring 400. The wiring 410 is coupled to the wiring 420 through the via V20. The wiring 420 is coupled to the resistance element 210 via the via V24. The resistance element 210 is coupled to the wiring 440 via the via V25. The wiring 440 forms a capacitance element C1 with the wiring 450 provided in the lower layer. The capacitance element C1 comprises a capacitance between wirings.

The wiring 300 and the wiring 440 described in FIG. 10 with respect to the hybrid coupler 100 in the first embodiment are formed using the same metal wiring layer.

The wiring 310 and the wiring 450 are formed using the same metal wiring layer. By using the metal wiring layer of the same layer, the variation in the capacitance between the wirings of the hybrid coupler 100 and the variation in the capacitance between the wirings of the matching circuit 102 can be correlated with each other, and thus the robustness can be improved. That is, it is possible to compensate for the performance of the hybrid coupler 100 with respect to the variation of the capacitance value C, which is the capacitance between wirings.

(A second embodiment) Although the single-end type hybrid coupler has been described in the first embodiment above, a differential type hybrid coupler may be configured.

Figure 14:
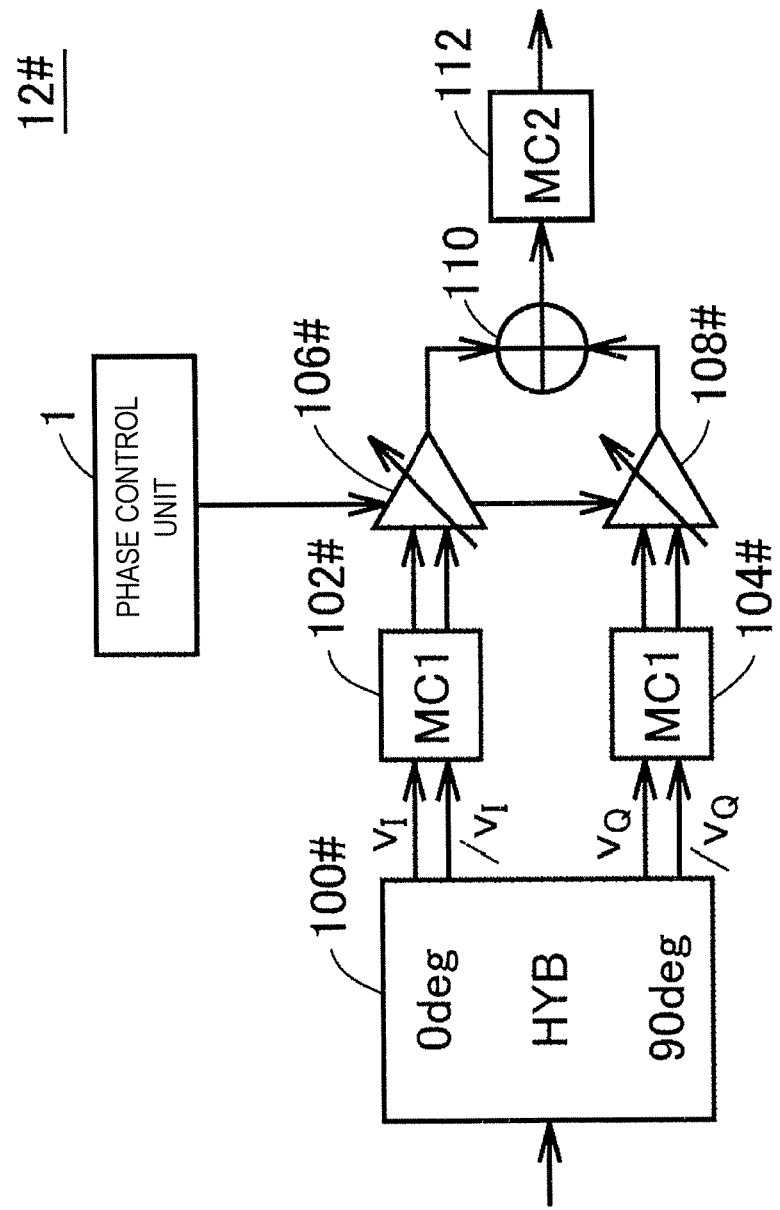
FIG. 14 is a block diagram illustrating a phase shifter 12 # according to the second embodiment.

FIG. 14 is a block diagram of the phase shifter 12 # according to the second embodiment. Referring to FIG. 14, phase shifter 12 # differs from phase shifter 12 in that hybrid coupler 100 is replaced with hybrid coupler 100 #, first matching circuits 102 and 104 (MC1) are replaced with first matching circuits 102 # and 104 # (MC1), and drivers 106 and 108 are replaced with drivers 106 # and 108 #. Since the other configurations are the same as those described with reference to FIG. 3, the detailed description thereof will not be repeated.

The hybrid coupler 100 # branches and outputs signals having equal amplitudes different in phase by 90 degrees from the input of the high-frequency signal and the input of the inverted signal. Specifically, output signals VI and VQ having phases different from each other by 90 degrees are output from those of the input signal VO. Output signals /VI and /VQ having phases different from each other by 90 degrees are output from those of the input signal /VO.

The input signal VO and the input signal /VO differ in phase by 180 degrees. Therefore, the output signal VI and the output signal /VI differ in phase by 180 degrees.

The output signal VQ and the output signal /VQ differ in phase by 180 degrees. The matching circuits 102 #, 104 #, and 112 are circuits for impedance matching.

The drivers 106 # and 108 # amplify the signals of the matching circuits 102 # and 104 #. The synthesizer circuit 110 synthesizes and outputs the outputs of the drivers 106 # and 108 #.

The matching circuit 112 is a circuit for matching the impedance from the output of the synthesizer circuit 110 to the input of the next stage.

Figure 15:
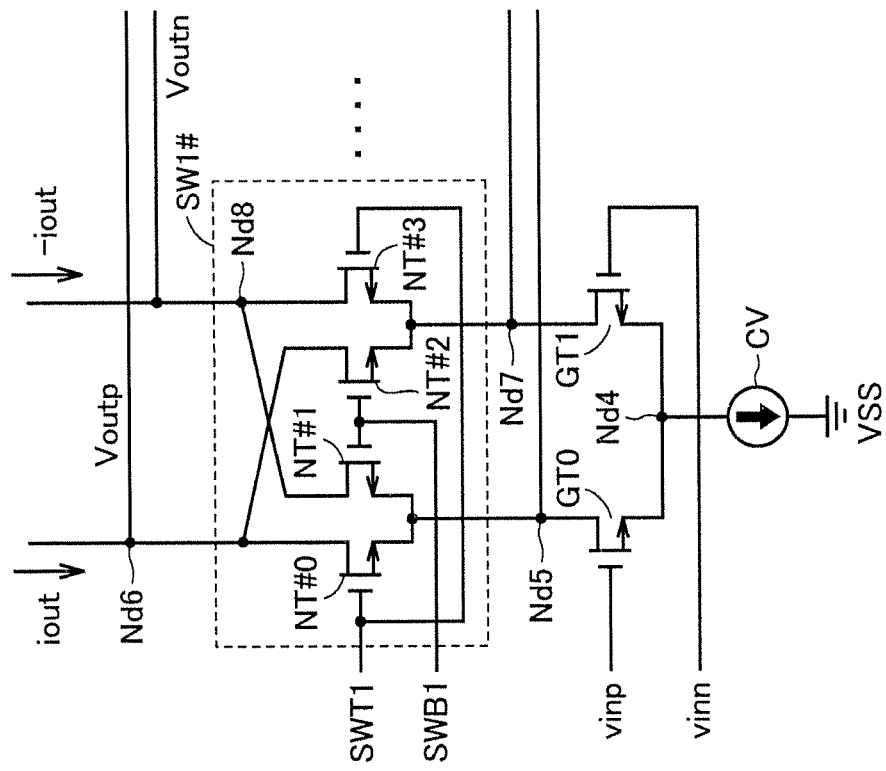
FIG. 15 is a diagram illustrating a circuit configuration of a driver 106 # according to the second embodiment.

FIG. 15 is a diagram illustrating a circuit configuration of the driver 106 # according to the second embodiment. As shown in FIG. 15, the driver 106 # includes gate transistors GT0, GT1 receiving inputs from the first matching circuit 102 #, and a plurality of switch circuits SW #1, SW #2, . . . coupled in parallel with each other.

The gate transistor GT0 is provided between the node Nd4 and the node Nd5, and its gate receives an input Vinp from the first matching circuit 102 #. In this embodiment, the input Vinp is an input from the output signal VI of the hybrid coupler 100 #.

The gate transistor GT1 is coupled in parallel with the gate transistor GT0, and is provided between the node Nd4 and the node Nd5, and its gate receives an input Vinn from the first matching circuit 102 #. The constant current source CV is provided between the ground voltage VSS and the node Nd4. In the present embodiment, the input Vinn is an input from the output signal/VI of the hybrid cup 100 #.

The plurality of switching circuits SW # are coupled in parallel between the node Nd5 and the node Nd6 and between the node Nd7 and the node Nd8, respectively.

The switch circuit SW #1 includes N-channel MOS transistors NT #0 to NT #3. N-channel MOS transistor NT #0 is coupled between the node Nd5 and the node Nd6, and its gate receives control signal SWT1 as an input. N-channel MOS transistor NT # 1 is coupled between node Nd5 and node Nd8, and its gate receives control signal SWB1 as an input. N-channel MOS transistor NT #2 is coupled between node Nd7 and node Nd6, and its gate receives the control signal SWB1 as an input. N-channel MOS transistor NT #3 is coupled between node Nd7 and node Nd8, and its gate receives the control signal SWT1 as an input.

The other switch circuits SW # have the same configuration as the switch circuit SW #1, include four N-channel MOS transistors, and receive control signals SWT and SWB as inputs, respectively.

The phase control unit 101 outputs control signals SWT and SWB for individually controlling the switch circuits SW # to control the phases of the output signal Voutp, Voutn. The output current flowing through the drivers 106 # is adjusted in accordance with on/off of the switching circuits SW #, and the phases of the output signals Voutp, Voutn output from the nodes Nd6, Nd8 can be adjusted.

FIG. 16 is a diagram illustrating a wiring structure of the hybrid coupler 100 # according to the second embodiment.

Figure 16A:
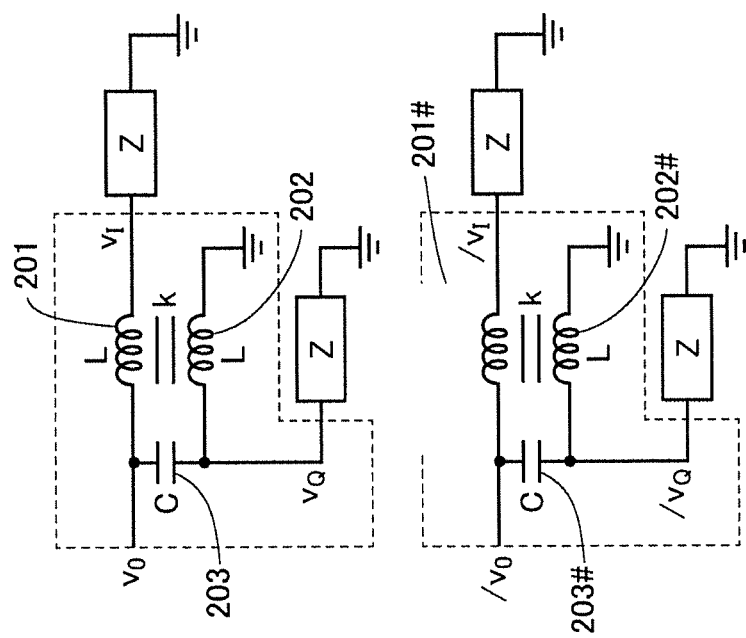
FIG. 16A and FIG. 16B are diagrams illustrating a wiring structure of the hybrid coupler 100 # according to the second embodiment.

Referring to FIG. 16, FIG. 16A shows a circuit diagram of the hybrid coupler 100 #. The components of the region enclosed by the dotted line are included.

The hybrid coupler 100 # includes inductors 201, 201 #, 202, and 202 #.

The inductor 201 and the inductor 202 are provided in parallel with each other. The input signal VO is input to one side of the inductor 201. The other side of the inductor 201 is coupled to a load (Z). The output signal VI is output from the other side of the inductor 201 to the load (Z).

The inductor 201 is coupled to the inductor 202 with mutual inductance. The coupling coefficient k is shown. The capacitance 202 provided between the inductors 201 and 202 is the capacitance between the wiring of the inductors 201 and 202. One side of the inductor 202 is coupled to a load (Z). The other side of the inductor 202 is grounded. Here, the inductance values of the inductors 201 and 202 are shown as L. The value of the capacitance between the wirings is shown as C.

The output signal VQ is output from one side of the inductor 202 to the load (Z). The hybrid coupler 100 outputs output signals VI and VQ against the input signal VO.

The inductor 201 # and the inductor 202 # are provided in parallel with each other. An input signal /VO is input to one end of the inductor 201 #. The other side of the inductor 201 # is coupled to a load (Z). The output signal /VI is output from the other side of the inductor 201 # to the load (Z).

The inductor 201 # is coupled to the inductor 202 # with mutual inductance. The coupling coefficient k is shown. A capacitance 202 # provided between the inductors 201 # and 202 # is a capacitance between the wirings of the inductors 201 # and 202 #. One side of the inductor 202 # is coupled to a load (Z). The other side of the inductor 202 # is grounded. Here, the inductance values of the inductors 201 # and 202 # are shown as L. The value of the capacitance between the wirings is shown as C.

The output signal /VQ is output from one side of the inductor 202 # to the load (Z). The hybrid coupler 100 # outputs output signals /VI and /VQ against the input signal /VO.

Figure 16B:
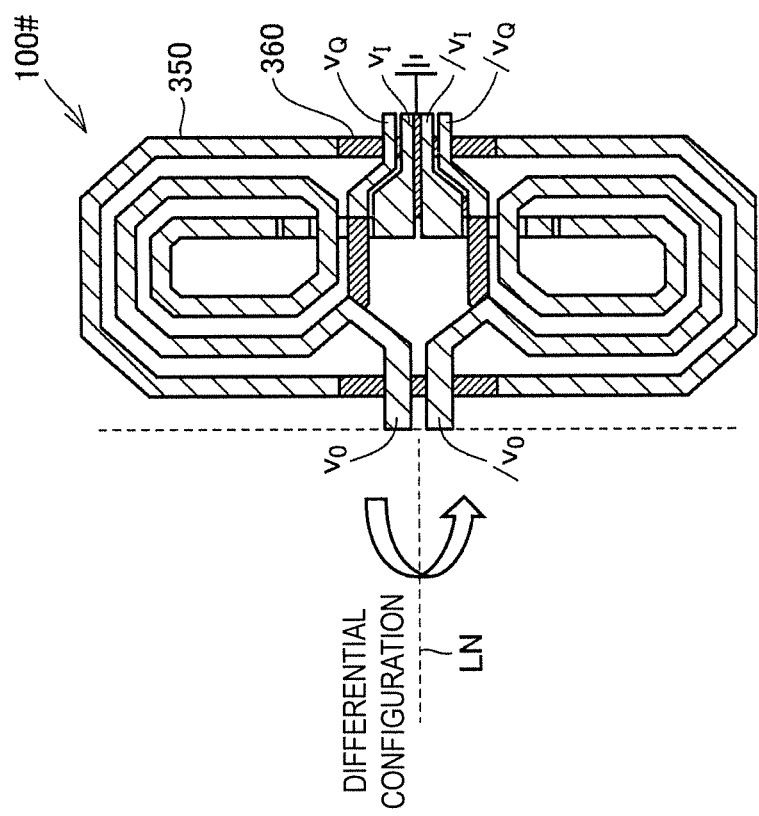

FIG. 16B shows a diagram where the hybrid coupler 100 # having a vertical structure is viewed from above.

Referring to FIG. 16B, the hybrid coupler 100 # is configured with a line-symmetrical fold relative to the centerline LN. The upper wiring structure of the hybrid coupler 100 # corresponds to a circuit structure for outputting the output signals VI and VQ against the input signal VO. The lower interconnection of the hybrid coupler 100 # corresponds to a circuit configuration for outputting the output signals /VI and /VQ against the input signal /VO.

Since each wiring structure is basically the same as that of the hybrid coupler 100 described with reference to FIG. 11B, detailed description thereof will not be repeated.

In addition, the wiring 350 and the wiring 360 in the lower layer are provided to surround the inductors 201, 201 #, 202, and 202 #. The wirings 350 and 360 are coupled to a ground line and perform a shield function.

FIG. 17 is another diagram illustrating the wiring structure of the hybrid coupler 100 # according to the second embodiment.

Figure 17A:
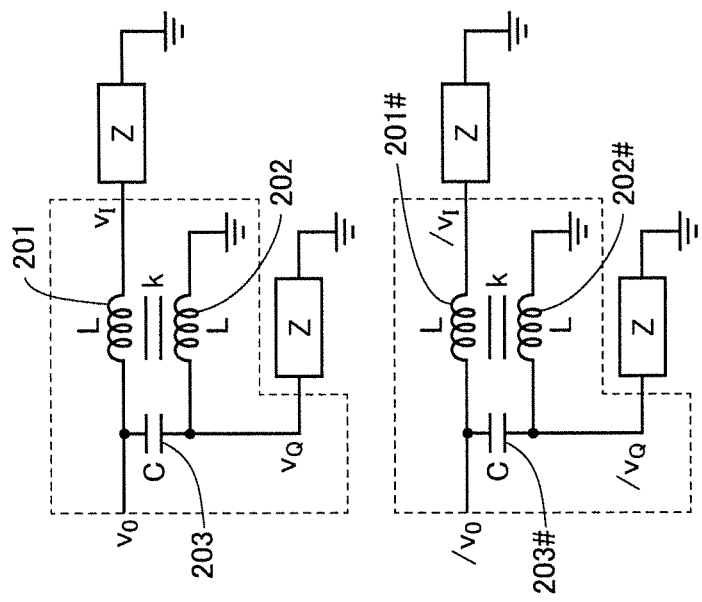
FIG. 17A and FIG. 17B are other diagrams illustrating the wiring structure of a hybrid coupler 100 # according to the second embodiment.

Referring to FIG. 17, FIG. 17A shows a circuit diagram of the hybrid coupler 100 #. The components of the region enclosed by the dotted line are included.

The hybrid coupler 100 # includes inductors 201, 201 #, 202, and 202 #. Since the circuit diagram is the same as that described with reference to FIG. 16, the detailed description thereof will not be repeated.

Figure 17B:
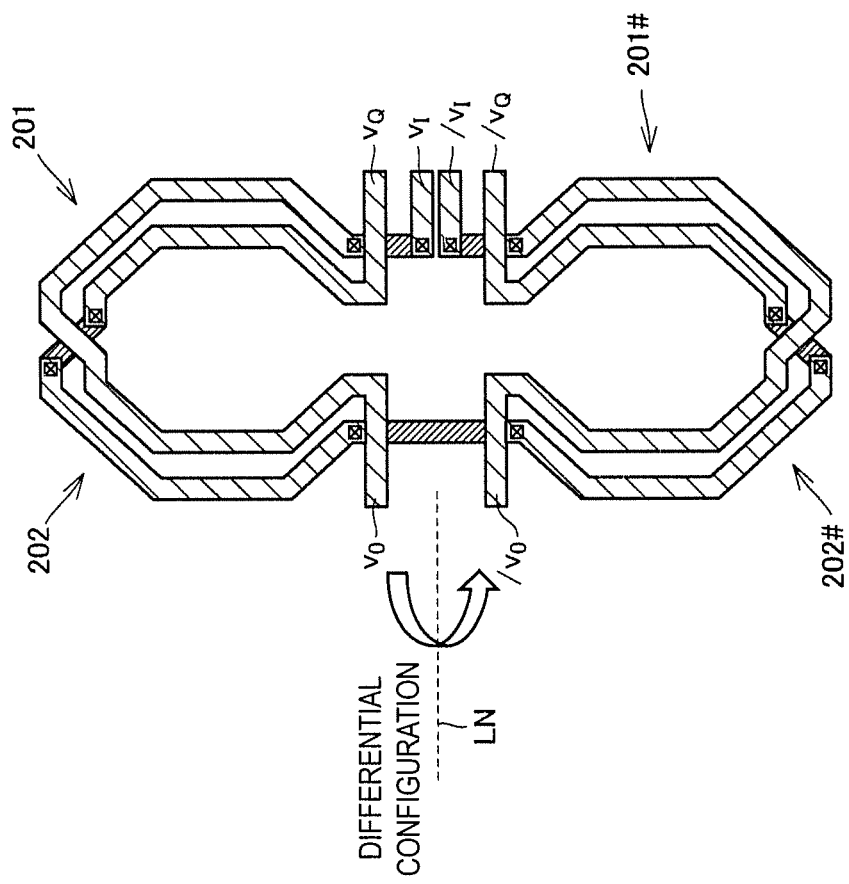

FIG. 17B shows a case where the hybrid coupler 100 # having a lateral structure is viewed from above.

Referring to FIG. 17B, the hybrid coupler 100 # is configured with a line-symmetrical fold relative to the centerline LN. The upper wiring structure of the hybrid coupler 100 # corresponds to a circuit structure for outputting the output signals VI and VQ against the input signal VO. The lower interconnection of the hybrid coupler 100 # corresponds to a circuit configuration for outputting the output signals /VI and /VQ against the input signal /VO.

Since each wiring structure is basically the same as that of the hybrid coupler 100 described with reference to FIG. 12B, detailed description thereof will not be repeated.

Figure 18:
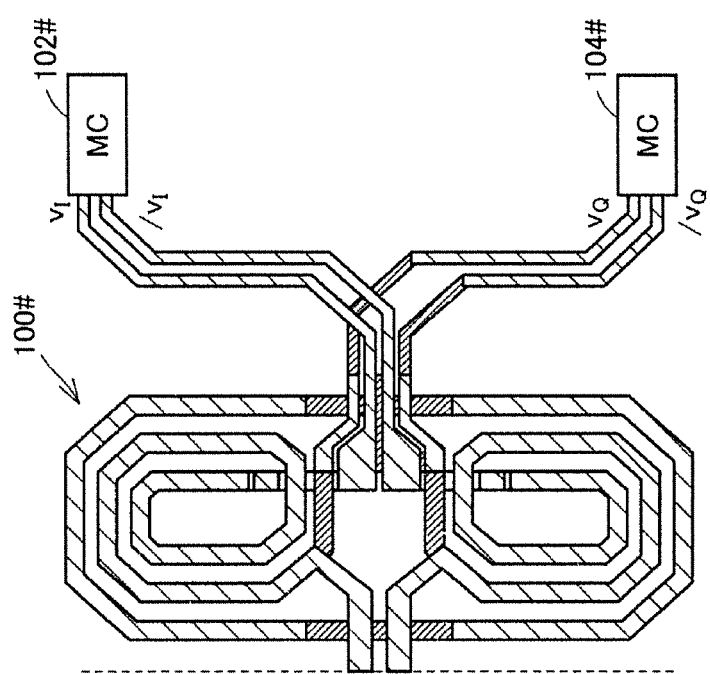
FIG. 18 is a diagram illustrating a connection between the hybrid coupler 100 # and the matching circuits 102 #, 104 #, according to the second embodiment.

FIG. 18 is a diagram illustrating the connection between the hybrid coupler 100 # and the matching circuits 102 # and 104 # according to the second embodiment.

Referring to FIG. 18, the relationship of wiring with the hybrid coupler 100 # is shown. Because of the differential configuration, the wiring of the differential signals and the first matching circuits 102 # and 104 # are coupled to each other.

More specifically, the first matching circuits 102 #(MC1) are coupled to the I-side output signals VI and /VI. The first matching circuit 104 # (MC1) is coupled to the Q-side output signals VQ and /VQ.

Figure 19:
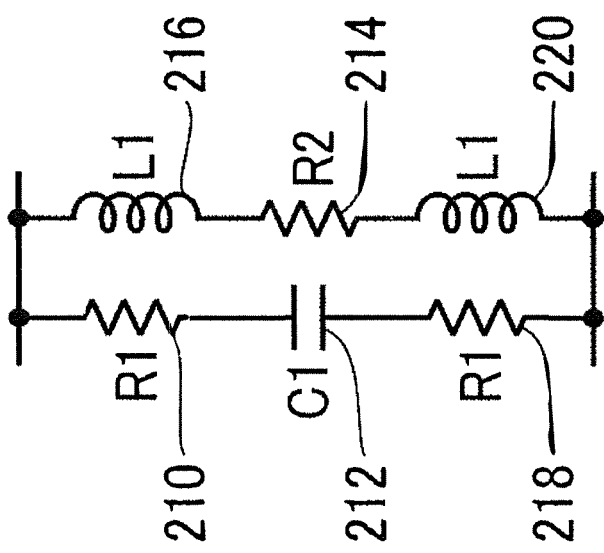
FIG. 19 is a circuit diagram illustrating the first matching circuit 102 # according to the second embodiment.

FIG. 19 is a circuit diagram of the first matching circuit 102 # according to the second embodiment. Referring to FIG. 19, the first matching circuit 102 # is different from the first matching circuit 102 in that a resistance element 218 and an inductance 220 are further added. Since the other configurations are the same, detailed description thereof will not be repeated.

A resistance element 210, a capacitance element 212, and a resistance element 218 are coupled in series between signal lines having a differential configuration. In addition, an inductance 216 is coupled in parallel with the resistance element 210 between the signal lines having a differential configuration, and a resistance element 214 and an inductance 220 are coupled in series with the inductance 216. Since the matching circuit 104 # has the same configuration as the matching circuit 102 #, detailed description thereof will not be repeated. The resistance values of resistance elements 210, 218, and 214 are shown as R1, R1, and R2, respectively. The inductance values of the inductances 216 and 220 are shown as L1. The capacitance value of the capacitance element 212 is shown as C1.

FIG. 20 is a diagram illustrating a wiring structure of the first matching circuits 102 # and 104 # according to the second embodiment.

Figure 20A:
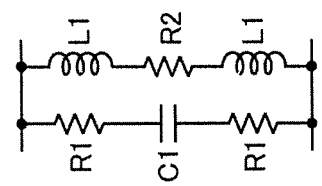

FIG. 20A shows a circuit diagram of the first matching circuit 102 #. As shown in FIG. 20A, the first matching circuit 102 # includes two resistance elements R1, R2, a capacitance element C1, and two inductors L1.

FIG. 20B shows a case where the first matching circuit 102 # is viewed from above. Referring to FIG. 20B, the output signal VI is input from one end of the wiring 500.

An output signal /VI is input from one end of the wiring 516. The wiring 500 is coupled to the resistor element 210 provided in the lower layer through the via V30. The resistance element 210 is coupled to the wiring 512 through the via V31. A wiring 514 is provided below the wiring 512, and a capacitance element C1 is formed by the wiring 512 and the wiring 514.

The capacitance element C1 comprises a capacitance between wirings. The wiring 514 is coupled to the resistance element 218 via the via V32. The resistance element 218 is coupled to the wiring 516 through the via V33.

The wiring 500 is coupled to the wiring 542 in the lower layer through the via V44. The wiring 542 is coupled to the wiring 540 through the via V43. The wiring 540 is coupled to the wiring 539 in the lower layer through the via V42. The wiring 539 is coupled to the wiring 538 in the upper layer through the via V41. The wiring 538 in the upper layer is coupled to an input terminal on one side of the driver 106 #, which is a load.

The wiring 516 is coupled to the wiring 518 in the lower layer through the via V34. The wiring 518 is coupled to the wiring 520 in the upper layer through the via V35. The wiring 520 is coupled to an input terminal on the other side of the driver 106 #, which is a load.

The wiring 538 is provided in a loop shape to be coupled to another wiring to form the inductor L1. The wiring 538 is coupled to the wiring 536 in the lower layer through the via V37. The wiring 536 is coupled to the wiring 534 in the upper layer through the via V36. The wiring 534 is coupled to the wiring 532 in the lower layer through the via V35. The wiring 532 is coupled to the wiring 530 in the upper layer through the via V40. The wirings 530, 532, 534, and 538 are provided in a loop shape. The wiring 530 is coupled to the resistance element 214 through the via V39. The resistance element 214 is coupled to the wiring 524 in the upper layer through the via V38. The wiring 524 is coupled to the wiring 522 through the via V37. The wiring 522 is coupled to the wiring 520 through the via V36.

The wirings 524, 522, and 520 are provided in a loop shape. In this example, the configuration of the first matching circuit 102 # has been described, but the same applies to the first matching circuit 104 #.

The same first matching circuit 104 # is also provided on the Q side. Because of the large mutual interference between the inductors, the inductors can be designed such that the interference of matching inductors on the I and Q sides is differentially cancelled.

The wiring described with reference to FIG. 15 with respect to the hybrid coupler 100 # in the second embodiment and the wiring of the first matching circuit 102 # are formed using the same metal wiring layer.

By using the metal wiring layer of the same layer, it is possible to correlate the variation of the capacitance between the wirings of the hybrid coupler 100 # and the variation of the capacitance between the wirings of the first matching circuit 102 #, and thus it is possible to improve the robustness. That is, it is possible to compensate for the performance of the hybrid coupler 100 # with respect to the variation of the capacitance value C, which is the capacitance between wirings.

(A third Embodiment) In the above-described first and second embodiments, a phase shifter 12 in the radar system 1 has been described as an example, but the phase shifter 12 is not used only for the radar system 1, but is also applicable to other systems.

For example, the present invention can be applied to a circuit for converting a serial signal into a parallel signal (SERializer/DESerializer) in a bus of a computer or the like.

Figure 21:
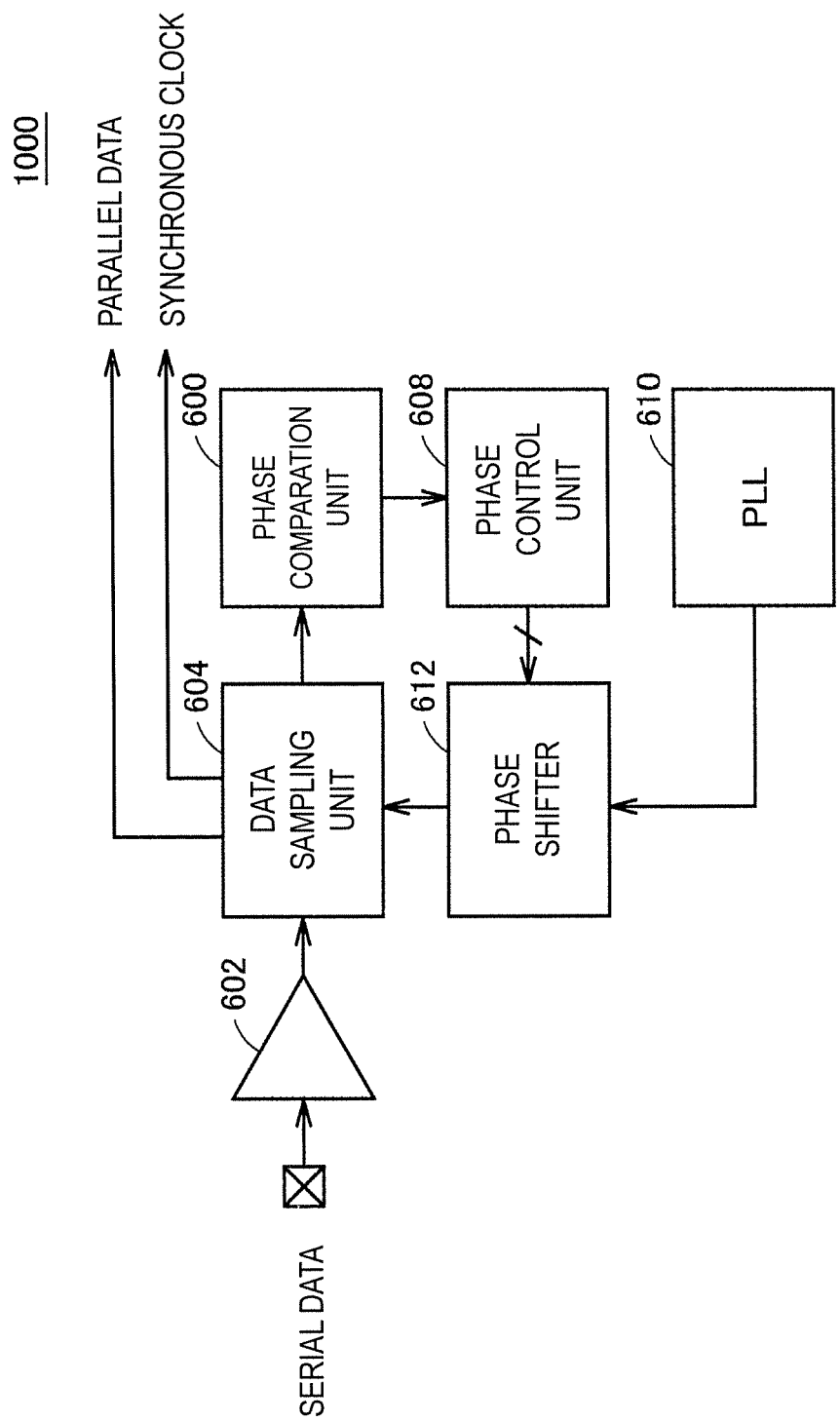
FIG. 21 is a block diagram illustrating a configuration of a conversion circuit 1000 according to a third embodiment.

FIG. 21 is a block diagram illustrating a configuration of a conversion circuit 1000 according to the third embodiment. Referring to FIG. 21, conversion circuit 1000 includes an amplifier 602, a data sampling unit 604, a phase comparison unit 600, a phase control unit 608, a PLL circuit 610, and a phase shifter 612.

The conversion circuit 1000 is a serial-parallel conversion circuit that receives serial data and outputs parallel data and a synchronous clock.

The amplifier 602 amplifies the signal of the serial data and outputs the amplified signal to the data sampling unit 604.

The data sampling unit 604 acquires serial data as sampling data based on a predetermined clock signal, and outputs parallel data and a synchronous clock signal to the outside.

The PLL circuit 610 generates a predetermined clock signal and outputs it to the phase shifter 612. The phase comparison unit 600 compares whether the predetermined clock signal is sampling the serial data at an appropriate phase timing or not.

The phase comparison unit 600 outputs the comparison result to the phase control unit 608. The phase control unit 608 instructs the phase shifter 612 to adjust the phase of the predetermined clock signal based on the comparison result from the phase comparison unit 600.

The phase shifter 612 adjusts the phase of a predetermined clock signal in accordance with an instruction from the phase control unit 608, and outputs the adjusted clock signal to the data sampling unit 604.

Figure 22:
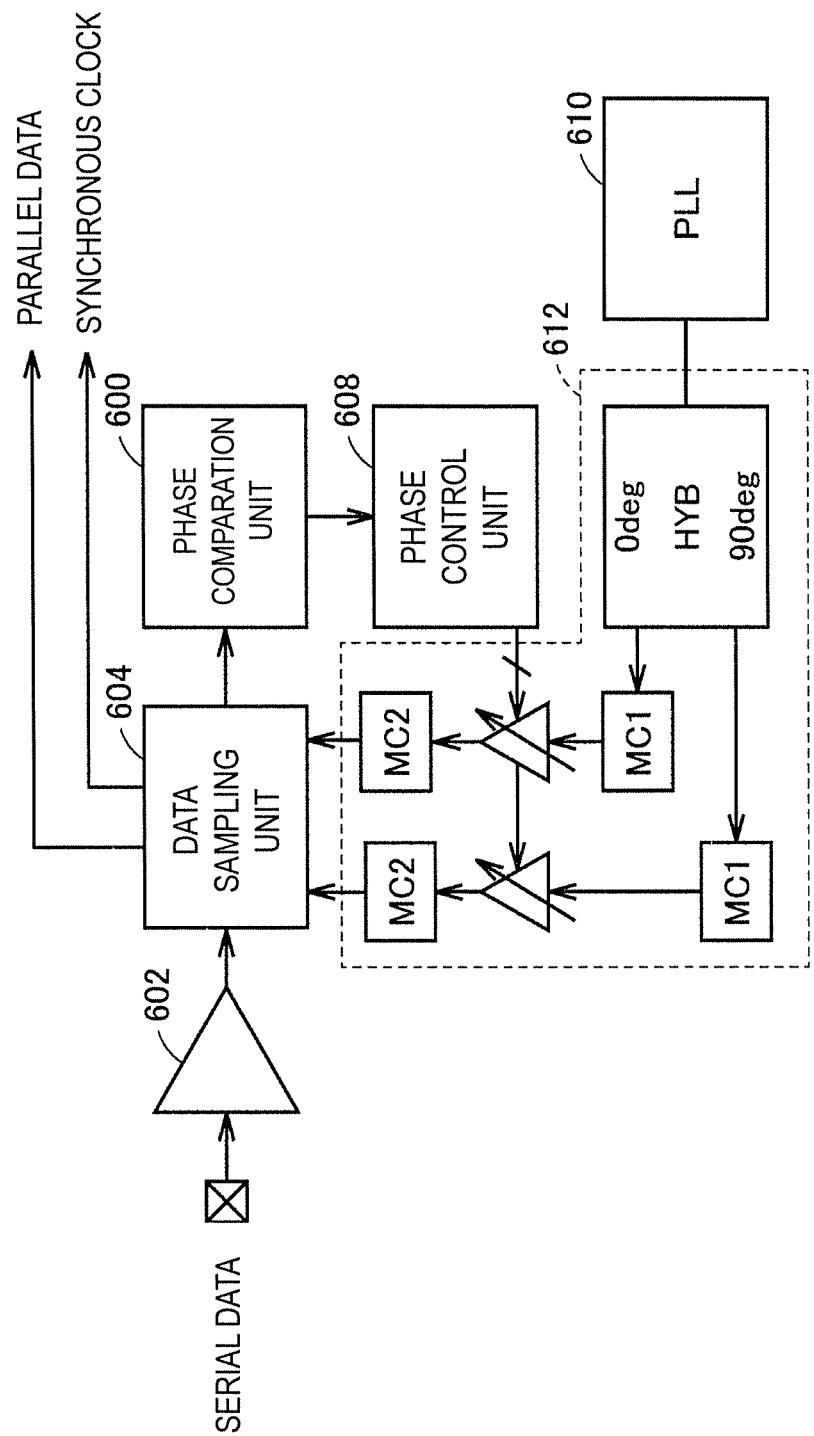
FIG. 22 is a circuit block diagram illustrating a phase shifter 612 according to the third embodiment.

FIG. 22 is a circuit block diagram of the phase shifter 612 according to the third embodiment. With reference to FIG. 22, the phase shifter 612 can also be adjusted in phase by the same configuration as that described with reference to the phase shifter 12 of FIG. 3. In comparison with the configuration of FIG. 3, the second matching circuit is provided for each of the drivers 106 and 108 instead of the synthesizer circuit 110.

With this configuration, it is possible to improve the accuracy of the phase control of the predetermined clock signal. Although the present disclosure has been specifically described based on the embodiments described above, the present disclosure is not limited to the embodiments, and it is needless to say that various modifications can be made without departing from the gist thereof.

What is claimed is:

1. A phase shifter comprises:
   a hybrid coupler circuit including a first output node and a second output node that outputs a first output signal and a second output signal that is out of phase with the first output signal respectively against an input;
   a first amplifier circuit including a first input node receiving the first output signal that amplifies the first output signal;
   a second amplifier circuit including a second input node receiving the second output signal and amplifying the second output signal;
   a first impedance matching circuit that performs impedance matching between the first output node and the first input node and
   a second impedance matching circuit that performs impedance matching between the second output node and the second input node,
   wherein the first impedance matching circuit includes:
      a first resistance element;
      a first capacitance element;
      a first inductor, and
      a second resistance element,
         wherein one end of the first resistance element is coupled to the first output node, and the other end of the first resistance element is coupled to one end of the first capacitance element,
         wherein one end of the first inductor is coupled to the first output node, and the other end of the first inductor is coupled to one end of the second resistance element,
         wherein the second impedance matching circuit includes:
            a third resistance element,
            a second capacitance element,
            a second inductor,
            a fourth resistance element,
            wherein one end of the third resistance element is coupled to the second output node, and the other end of the third resistance element is coupled to one end of the second capacitance element,
            wherein one end of the second inductor is connected to the second output node, and the other end of the second inductor is coupled to one end of the fourth resistance element.

2. The phase shifter according to claim 1, further comprising a ground line coupled to the other end of the first capacitance element and to the other end of the first inductor.

3. The phase shifter according to claim 1, further comprising:
   a phase control unit that outputs a control signal configured to control the phase of the output of the first and second amplifier circuits, and
   a synthesizer circuit coupled to the first and second amplifier circuits,
   wherein the first amplifier circuit adjusts the phase of the first output signal based on the control signal to generate a third output signal,
   wherein the second amplifier circuit adjusts the phase of the second output signal based on the control signal to generate a fourth output signal,
   wherein the synthesizer circuit synthesizes the third output signal and the fourth output signal.

4. A radar system comprising:
   a PLL circuit;
   a plurality of the phase shifter according to claim 3, to which an output signal of the PLL circuit are input;
   a power amplifier that amplifies the output signal of the phase shifter;
   a first antenna that outputs an output signal of the power amplifier as an electromagnetic wave;
   a second antenna that receives the reflected electromagnetic wave,
   a low noise amplifier that amplifies an input signal from the second antenna, and
   a mixer that synthesizes an output signal of the low noise amplifier and an output signal of the PLL circuit.

5. The phase shifter according to the claim 1, wherein the hybrid coupler circuit further comprises:
   a third inductor that outputs the first output signal;
   a fourth inductor that is coupled to the third inductor with mutual inductance that outputs the second output signal and
   a third capacitance element that is provided between the third inductor and the fourth inductor.

6. The phase shifter according to claim 5,
   wherein the third inductor and the fourth inductor are formed of a first metal wiring layer and a second metal wiring layer over the first metal wiring layer,
   wherein the first to third capacitance elements correspond to capacitances between the first metal wiring layer and the second metal wiring layer.

7. The phase shifter according to claim 5,
   wherein the third inductor and the fourth inductor are formed of the same metal wiring layer,
   wherein the first and second capacitance elements are formed using the same metal wiring layer.

8. The phase shifter according to claim 1,
   wherein the hybrid coupler circuit further includes a third output node and a fourth output node receiving an inverted signal of the input that outputs a third output signal and a fourth output signal that is out of phase with the third output signal respectively,
   wherein the first amplifier circuit further includes a third input node receiving the third output signal,
   wherein the second amplifier circuit further includes a fourth input node receiving the fourth output signal,
   wherein the first impedance matching circuit further includes:
      a fifth resistance element and
      a fifth inductor,
         wherein one end of the fifth resistance element is coupled to the third output node, and the other end of the fifth resistance element is coupled to the other end of the first capacitance element, wherein one end of the fifth inductor is coupled to the third output node, and the other end of the fifth inductor is coupled to the other end of the second resistance element, wherein the second impedance matching circuit further includes:

a sixth resistance element and a sixth inductor, wherein one end of the sixth resistance element is coupled to the fourth output node, and the other end of the sixth resistance element is coupled to the other end of the second capacitance element, wherein one end of the sixth inductor is coupled to the fourth output node, and the other end of the sixth inductor is coupled to the other end of the fourth resistance element.

9. The phase shifter according to claim 8, wherein the hybrid coupler circuit further comprises:

a seventh inductor that outputs the third output signal;

an eighth inductor that is coupled to the fifth inductor with mutual inductance that outputs the fourth output signal and a fourth capacitance element that is provided between the seventh inductor and the eighth inductor.

10. The phase shifter according to claim 9, wherein the third and fourth inductors and the seventh and eighth inductors are respectively formed of a first metal wiring layer and a second metal wiring layer over the first metal wiring layer, wherein the first to third capacitance elements comprises wiring capacitance between the first metal wiring layer and the second metal wiring layer.

11. The phase shifter according to claim 9, wherein the third and fourth inductors are formed of a first metal wiring layer, and the seventh and eighth inductors are formed of the first metal wiring layer, wherein the first and second capacitance elements are formed using the first metal wiring layer.

12. The phase shifter of claim 9, further comprising:

a phase control unit that controls the phase of the outputs of the first and second amplifier circuits and a synthesizer circuit that synthesizes the outputs of the first and second amplifier circuits.

13. A radar system comprising:

a PLL circuit;

the phase shifter according to claim 12, to which an output signal of the PLL circuit are input;

a power amplifier that amplifies the output signal of the phase shifter;

a first antenna that outputs an output signal of the power amplifier as an electromagnetic wave;

a second antenna that receives a reflected electromagnetic wave;

a low noise amplifier that amplifies an input signal from the second antenna, and a mixer that combines an output signal of the low noise amplifier and an output signal of the PLL circuit.

* * * * *